United States Patent [19]
Futagami

[11] Patent Number: 5,901,305
[45] Date of Patent: May 4, 1999

[54] SIMULATION METHOD AND APPARATUS FOR SEMICONDUCTOR INTEGRATED CIRCUIT

[75] Inventor: Tomoyuki Futagami, Tokyo, Japan

[73] Assignee: NEC Corporation, Tokyo, Japan

[21] Appl. No.: 08/949,818

[22] Filed: Oct. 14, 1997

Related U.S. Application Data

[63] Continuation of application No. 08/408,296, Mar. 22, 1995, abandoned.

[30]     Foreign Application Priority Data

Mar. 24, 1994  [JP]  Japan ..................................... 6-053440

[51] Int. Cl.⁶ ..................................................... G06F 17/50
[52] U.S. Cl. ........................... 395/500; 364/488; 364/489; 364/490; 364/578
[58] Field of Search ..................................... 364/488–491, 364/578; 395/500

[56]               References Cited

U.S. PATENT DOCUMENTS 4,701,860  10/1987  Mader ...................................... 364/488
5,446,676   8/1995  Huang et al. ............................ 364/578
5,471,409  11/1995  Tani ......................................... 364/578

FOREIGN PATENT DOCUMENTS 2-280278  11/1990  Japan .

OTHER PUBLICATIONS

Martinez ("Quick Estimation of Transient Currents in CMOS Integrated Circuits", IEEE Journal of Solid–State Circuits, vol. 24, No. 2, pp. 520–531), Apr. 1989.

Primary Examiner—Emanuel Todd Voeltz
Assistant Examiner—Phallaka Kik
Attorney, Agent, or Firm—Foley & Lardner

[57]               ABSTRACT

The invention provides a simulation method and apparatus for a semiconductor integrated circuit which can perform simulation of an operation characteristic of each of a plurality of circuit blocks of a semiconductor integrated circuit and simulation of simultaneous operation characteristics when a plurality of ones of the circuit blocks operate simultaneously and allows evaluation of counter-electromotive forces or the like which may cause a malfunction due to mutual intervention of the circuit blocks after the semiconductor integrated circuit is manufactured as a product. The simulation apparatus comprises a first simulation section for executing simulation of an operation characteristic for each circuit block, a first determination section for determining a result of the simulation, a library in which data regarding mutual intervention which occurs when a plurality of ones of the circuit blocks operate simultaneously are stored, a second simulation section for executing simulation of simultaneous operation characteristics using the data of mutual intervention stored in the library, and a second determination section for determining a result of the simulation of the second simulation section.

5 Claims, 6 Drawing Sheets

SIMULATION METHOD AND APPARATUS FOR SEMICONDUCTOR INTEGRATED CIRCUIT

This application is a continuation, of application Ser. No. 08/408,296, filed Mar. 22, 1995; now abandoned.

BACKGROUND OF THE INVENTION

1. Field of the Invention

This invention relates to a simulation method and apparatus for a semiconductor integrated circuit, and more particularly to a simulation method and apparatus which can simulate simultaneous operation characteristics of a semiconductor integrated circuit having a plurality of circuit blocks blocked for individual function units operate simultaneously, and make a determination of the simulation.

2. Description of the Related Art

Conventionally, in ordinary simulation for a semiconductor integrated circuit (IC), a net list which is connection information of an object circuit for designing such as a logic circuit blocked for each function unit and a test pattern which is testing information are inputted, and an output of a result of the simulation of the object circuit for designing and a designed expected value are compared with each other to determine whether or not the operation of the object circuit for designing is appropriate. Further, a delay value, a current consumption and so forth of the object circuit for designing are calculated using a library in which characteristic data of the object circuit for designing are stored to determine whether or not the specifications of the circuit are appropriate.

Further, as disclosed in Japanese Patent Laid-Open Application No. Heisei 2-280278, in simulation for an analog LSI (large scale integrated circuit), an object circuit for designing is divided into an already designed circuit portion and a newly designed circuit portion, and the already designed circuit portion is analyzed making use of characteristic data stored in a library while only the newly designed circuit portion is newly analyzed by execution of simulation to determine whether or not the specifications of the object circuit for designing are appropriate.

The conventional simulation apparatus for a semiconductor integrated circuit will be described with reference to FIG. 7. The conventional simulation apparatus includes an inputting section 1 for inputting a net list of a circuit block which is an object unit internal circuit for designing blocked for each predetermined function unit and a test pattern, a simulation section 2 for executing simulation, a determination section 3 for determining a result of simulation, an outputting section 4 for outputting a result of determination of simulation, and a library 5 in which delay times and other electric characteristic data of the circuit blocks are stored.

Subsequently, a conventional simulation method executed by the simulation apparatus of FIG. 7 will be described with reference to a flow chart of FIG. 8. If it is assumed that an object semiconductor integrated circuit for designing includes n circuit blocks, a net list of a first circuit block of the semiconductor integrated circuit and a test pattern will first be inputted to the inputting section 1 (steps P1 and P2). In response to the inputted net list and test pattern, the simulation section 2 executes predetermined simulation of a logic operation, a delay, a power consumption and so forth for the first circuit block using the data stored in the library 5 (step P3). Then, the determination section 3 compares a result of the simulation with a designed value of the first circuit block to determine whether or not the result of the simulation satisfies the specification, and outputs a result of the determination by way of the outputting section 4 (steps P4 and P5). Then at the next step P6, it is determined whether or not simulation has completed for all of the n circuit blocks, and here, since simulation has not completed for all of the n circuit blocks, the control sequence returns to step P1 to repeat the operations at steps P1 to P6 in a similar manner for the second circuit block and then for the third to n-th circuit blocks. When it is determined at step P6 that simulation has completed for the n-th circuit block, the processing is ended.

In the conventional simulation method and apparatus, however, since simulation is executed merely for each of circuit blocks constituting a semiconductor integrated circuit, a satisfactory result is not obtained in regard to an analysis for the case wherein a plurality of circuit blocks operate simultaneously. In other words, since simulation is conventionally executed for each of circuit blocks constituting a semiconductor integrated circuit, the conventional simulation method and apparatus ignores an influence of mutual intervention of the circuit blocks which is caused by impedances of power supply lines of the semiconductor integrated circuit including leads for external connection and bonding wires for internal connection, particularly inductance components which may cause a malfunction upon simultaneous operation of a plurality of circuit blocks of an actual semiconductor integrated circuit manufactured as a product. Consequently, with the conventional simulation method and apparatus, it is impossible to evaluate noise of counter-electromotive forces produced by electric currents flowing through the inductance components.

SUMMARY OF THE INVENTION

It is an object of the present invention to provide a simulation method and apparatus for a semiconductor integrated circuit which can perform, in addition to a simulation of individual operation characteristics of a plurality of circuit blocks of a semiconductor integrated circuit, simulation of simultaneous operation characteristics when a plurality of circuit blocks operate simultaneously and consequently allows evaluation of counter-electromotive forces or the like which may cause a malfunction due to mutual intervention of the circuit blocks after the semiconductor integrated circuit is manufactured as a product.

In order to attain the object described above, according to an aspect of the present invention, there is provided a simulation method for a semiconductor integrated circuit which includes a plurality of circuit blocks blocked for individual function units, comprising the steps of executing simulation of an operation characteristic for each of the circuit blocks, determining a result of the simulation, executing simulation of simultaneous operation characteristics of a plurality of ones of the circuit blocks which operate simultaneously using data of mutual intervention stored in advance in a library, and determining a result of the simulation.

According to another aspect of the present invention, there is provided a simulation apparatus for a semiconductor integrated circuit which includes a plurality of circuit blocks blocked for individual function units, comprising first simulation means for executing simulation of an operation characteristic for each of the circuit blocks, first determination means for determining a result of the simulation of the first simulation means, a library in which data regarding mutual intervention which occurs when a plurality of ones of the circuit blocks operate simultaneously are stored, second simulation means for executing simulation of simultaneous operation characteristics using the data of mutual intervention stored in the library, and second determination means for determining a result of the simulation of the second simulation means.

The simulation method and the simulation apparatus may be constructed such that the number of those of the circuit blocks which exhibit a simultaneous operation condition within a given period is counted and the simulation of simultaneous operation characteristics is executed only for the counted number of circuit blocks.

Alternatively, the simulation method and the simulation apparatus may be constructed such that the data of mutual intervention stored in the library include a current variation rate and a peak current value of each of those of the circuit blocks which exhibit a simultaneous operation condition when the circuit block operates individually and an impedance of a power supply line for each of the circuit blocks calculated from an equivalent circuit of power supply lines of the semiconductor integrated circuit, and the simulation of simultaneous operation characteristics is based on calculation of a sum total of counter-electromotive forces of the circuit blocks calculated from the current variation rates and peak values of the individual circuit blocks and the impedances whereas the determination of the result of the simulation is based on comparison of the sum total with a predetermined allowable value.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENT

Figure 1:
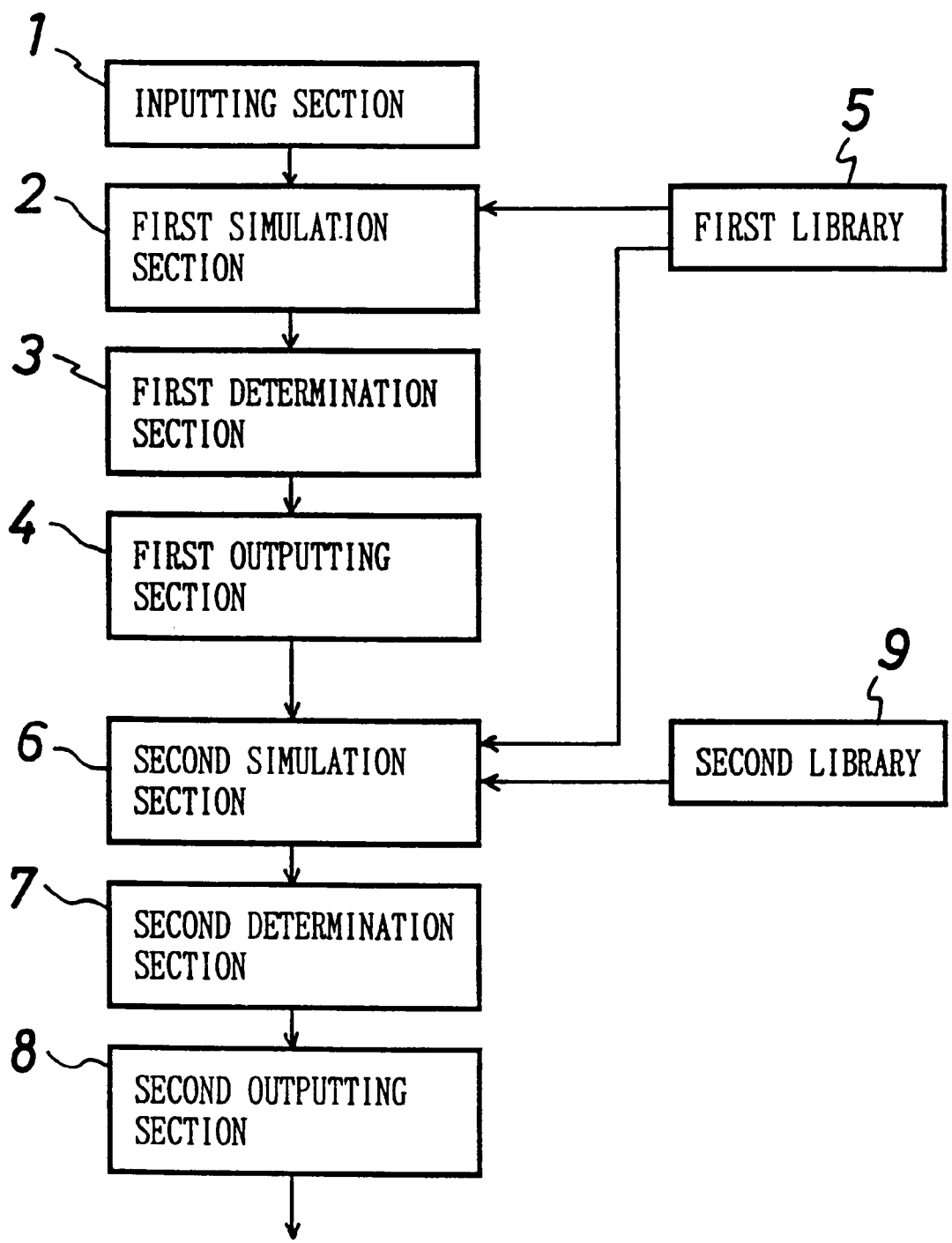
FIG. 1 is a block diagram of a simulation apparatus showing a preferred embodiment of the present invention.
Figure 7:
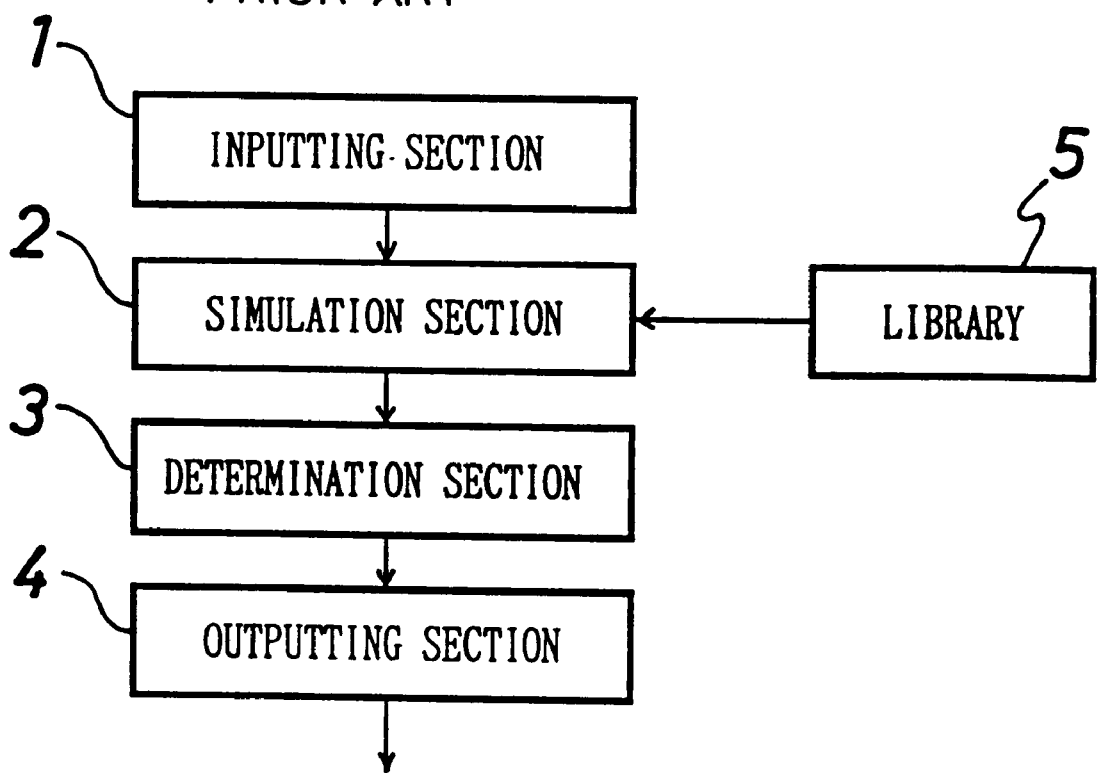
FIG. 7 is a block diagram showing a conventional simulation apparatus for a semiconductor integrated circuit.

Referring first to FIG. 1, there is shown in block diagram a simulation apparatus according to a preferred embodiment of the present invention. The simulation apparatus includes an inputting section 1, a first simulation section 2, a first determination section 3, a first outputting section 4 and a first library 5 which are all similar to those of the conventional simulation apparatus described hereinabove with reference to FIG. 7. The simulation apparatus further includes a second simulation section 6 for simulating simultaneous operation characteristics of a plurality of circuit blocks, a second determination section 7 for determining a result of simulation by the second simulation section 6, a second outputting section 8 for outputting a result of determination of the second determination section 7, and a second library 9 which stores current waveform characteristic data such as current variation rates and peak values of current waveforms of circuit blocks which operate simultaneously and mutual intervention data such as impedance data including inductances of leads for power supply lines, bonding wires and so forth of an object semiconductor integrated circuit for designing.

Figure 3:
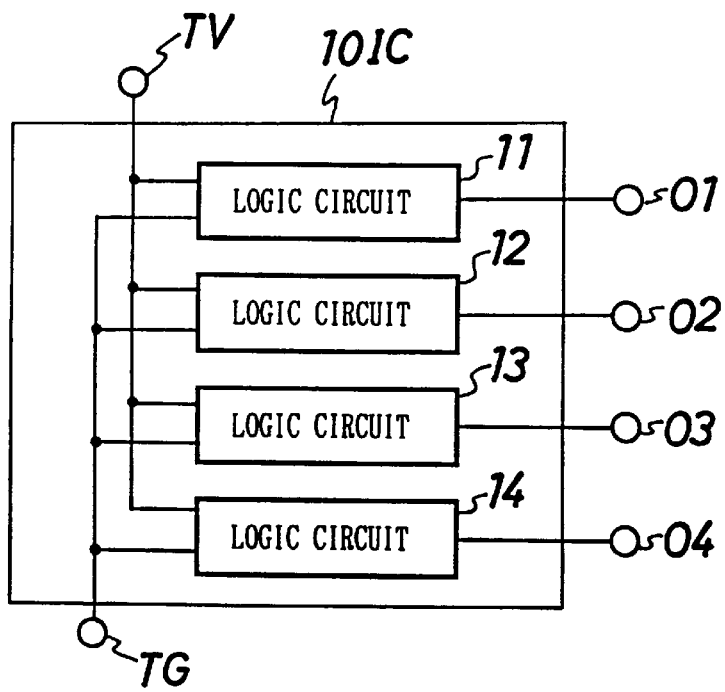
FIG. 3 is a block diagram showing an exemplary construction of an object semiconductor integrated circuit for designing.

FIG. 3 shows an exemplary construction of an object semiconductor integrated circuit 10 for simulation. The semiconductor integrated circuit 10 includes, as circuit blocks, four logic circuits 11, 12, 13 and 14 each provided with an output buffer. Reference character TV denotes a power source terminal common to the logic circuits 11 to 14, TG a ground terminal, and reference character 01 to 04 denote output terminals of the logic circuits 11 to 14, respectively.

Figure 4A:
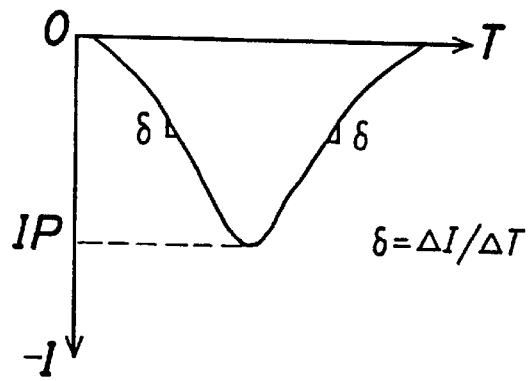
FIGS. 4(A) and 4(B) are waveform diagrams showing exemplary waveforms of a discharge current and a charging current, respectively, of a logic circuit in the semiconductor integrated circuit shown in FIG. 3.
Figure 4B:
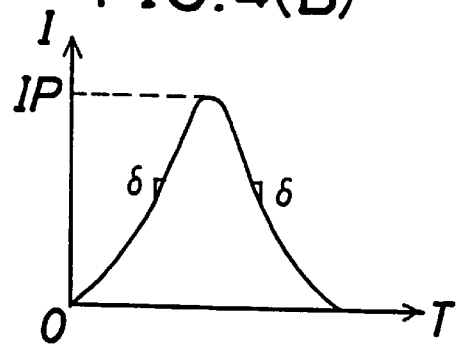

FIGS. 4(A) and 4(B) show waveforms of a discharge current and a charging current, respectively, of the logic circuits 11 to 14 as an example of current waveform characteristic data stored in the second library 9. Each of the data of the discharge current and the charging current includes data regarding a current peak value Ip and a current variation rate $\delta = \Delta I / \Delta T$.

Figure 5:
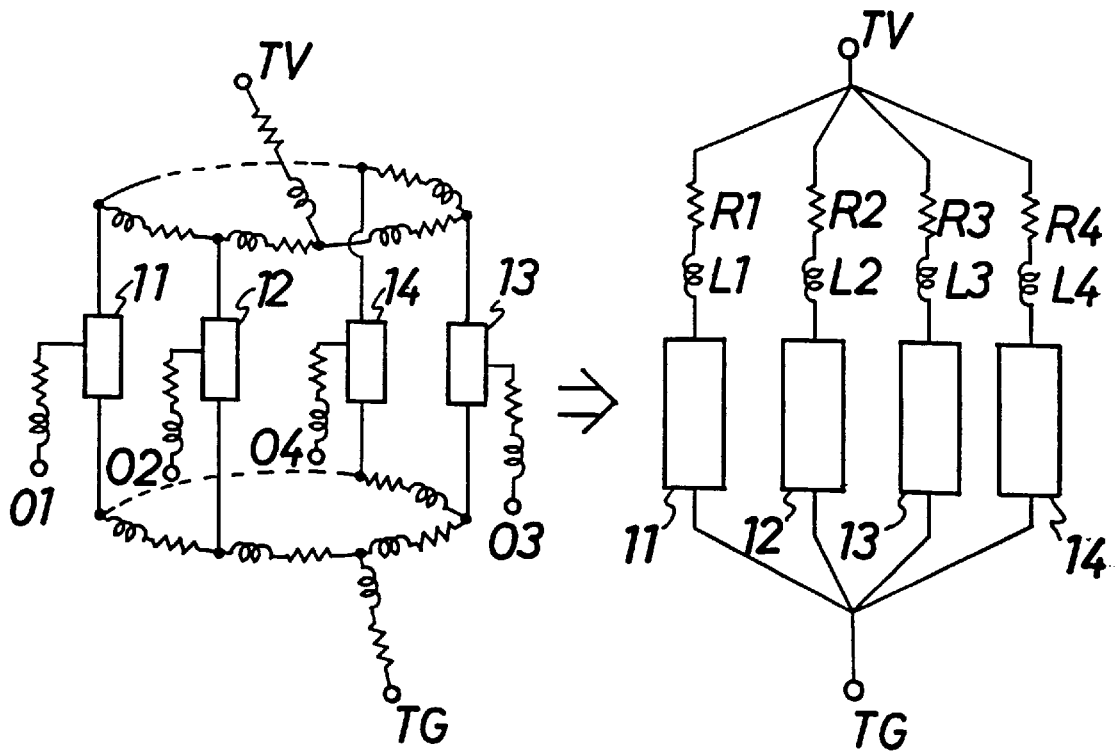
FIG. 5 is an equivalent circuit diagram schematically illustrating impedance data of power supply lines to the logic circuit shown in FIG. 3.

FIG. 5 is an equivalent circuit diagram schematically illustrating impedance data stored in the second library 9. The impedance data include four inductances L1 to L4 and four resistors R1 to R4 obtained by distributing the inductance and the resistance of common power supply lines from the power source terminal TV and the ground terminal TG to nodes of the logic circuits 11 to 14 by a calculation method well known in the art and adding peculiar inductance components and resistance components of the individual logic circuits 11 to 14 to the thus distributed resistance values and inductance values, respectively.

Figure 2:
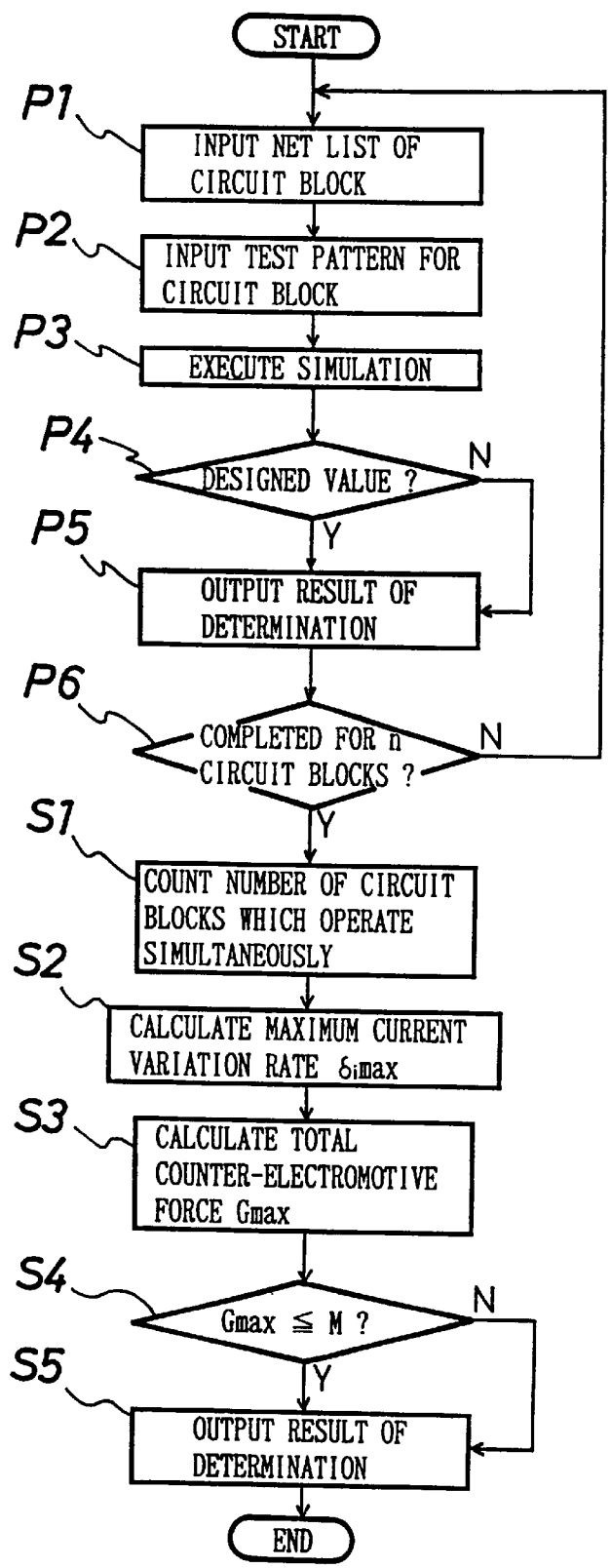
FIG. 2 is a flow chart illustrating exemplary simulation operation of the simulation apparatus shown in FIG. 1.
Figure 6:
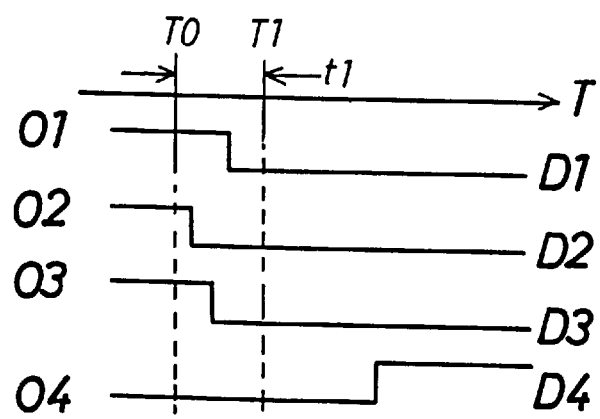
FIG. 6 is a time chart illustrating a delaying operation of the logic circuit shown in FIG. 3.
Figure 8:
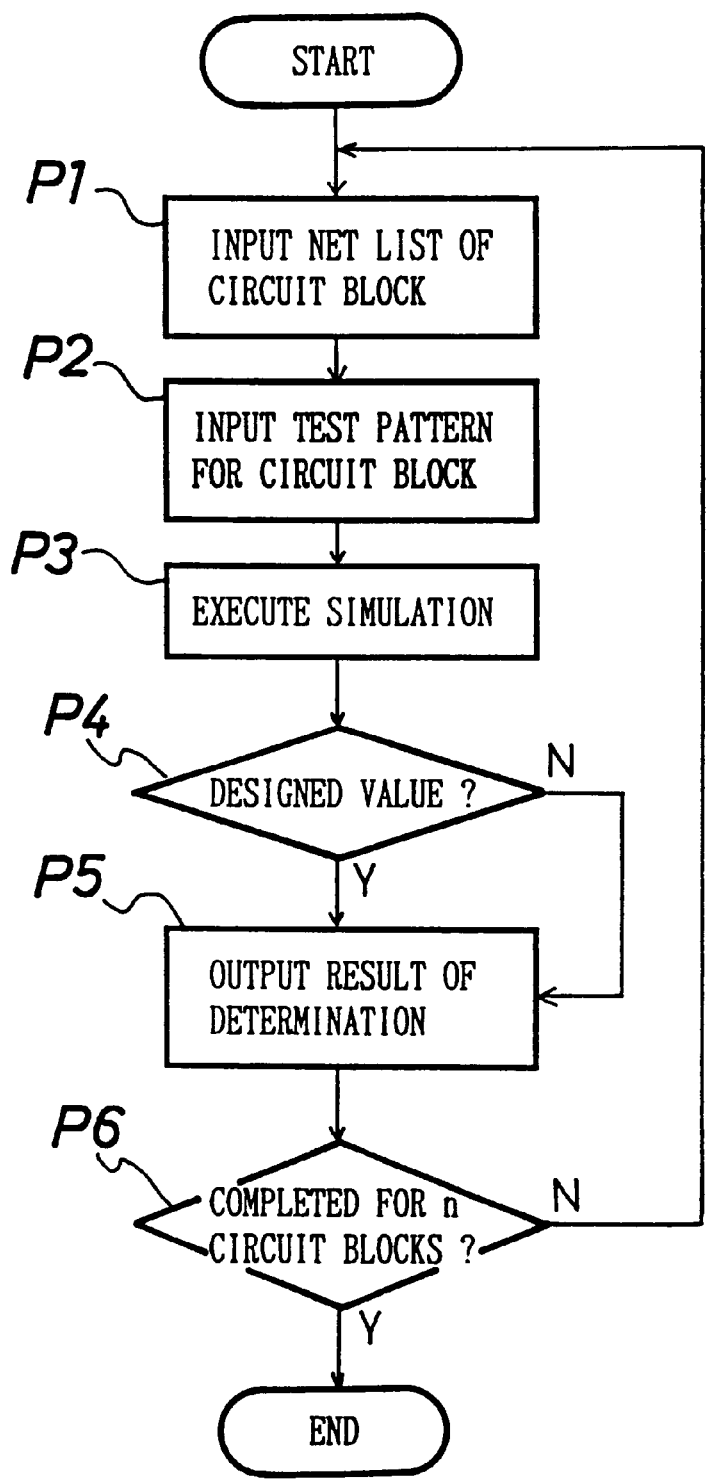
FIG. 8 is a flow chart illustrating simulation operation of the conventional simulation apparatus shown in FIG. 7.

Subsequently, a simulation method executed by the simulation apparatus of FIG. 1 described above will be described with reference to the flow chart of FIG. 2. At steps P1 to P6, the simulation apparatus operates in a similar manner as in the conventional simulation apparatus described hereinabove with reference to FIG. 8. In particular, a net list of a first circuit block, that is, the logic circuit 11, and a test pattern will first be inputted to the inputting section 1 (steps P1 and P2). In response to the inputted net list and test pattern, the first simulation section 2 executes predetermined simulation of a logic operation, a delay, a power consumption and so forth for the logic circuit 11 using data stored in the first library 5 (step P3). The delay from a preset time T0 of the output signal of the logic circuit 11 obtained by the simulation is represented by D1 as seen from FIG. 6. Then, the first determination section 3 compares a result of the simulation with a designed value for the logic circuit 11 to determine whether or not the result of the simulation satisfies the specification (step P4), and outputs a result of the determination by way of the first outputting section 4 (step P5). Then at next step P6, it is determined whether or not simulation has completed for all of the logic circuits, and when it is determined that simulation has not completed for all of the logic circuits, the control sequence returns to step P1. Consequently, the operations at steps P1 to P6 are repeated in a similar manner for the remaining logic circuits 12 to 14 to obtain delays D2 to D4 of the logic circuits 12 to 14, respectively Thereafter, the delays D1 to D4 are supplied to the second simulation section 6, by which simulation of simultaneous operation characteristics of the semiconductor integrated circuit 10 is subsequently executed in the following manner at steps S1 to S7.

First, the second simulation section 6 counts a number N of those of the logic circuits 11 to 14, which operate simultaneously, in accordance with the delays D1 to D4 supplied thereto (step S1). In this instance, the simultaneous operation number N is defined as the number of logic circuits whose delay falls within a period t1 from the time T0 to another preset time T1. In the example shown in FIG. 6, since the delays D1, D2 and D3 of the three logic circuits 11, 12 and 13 fall in the period t1, the simultaneous operation number N is "3". Subsequently, the discharge and charging waveform data including the current peak values Ip1, Ip2 and Ip3 and the current variation rates δ1, δ2 and δ3 of three signals A1 to A3 corresponding to the delays D1, D2 and D3, respectively, are recalled from the second library 9 to calculate respective maximum current variation rates δ1max, δ2max and δ3max (step S2). Then, the impedance data (inductances and resistances) regarding the logic circuits 11 12 and 13 are recalled from the second library 9, and using the maximum current variation rates δ1max, δ2max and δ3max and the current peak values Ip1, Ip2 and Ip3 calculated at step S2, a total counter-electromotive force Gmax which is a sum total of counter-electromotive forces produced by the simultaneous operations is calculated in accordance with the following equation:

$$Gmax = \sum_{i=1}^{3} (-LiSimax + RiIPi)$$

Then, a result of the calculation is supplied to the second determination section 7 (step S3).

Thereafter; the second determination section 7 determines whether or not the total counter-electromotive force Gmax is equal to or lower than an allowable value M (step S4). Then, a result of the determination is outputted by way of the second outputting section 8, thereby completing the processing (step S5).

Having now fully described the invention, it will be apparent to one of ordinary skill in the art that many changes and modifications can be made thereto without departing from the spirit and scope of the invention as set forth herein.

What is claimed is:

1. A simulation method for a semiconductor integrated circuit which includes a plurality of circuit blocks blocked for individual function units, comprising the steps of:

inputting a net list and a test pattern, wherein the net list includes connection information on each of said circuit blocks;

executing a first individual simulation for each of said circuit blocks using first data, the net list, and the test pattern to obtain first operation characteristic data including delays for each of the circuit blocks, wherein the first data corresponds to functions, stored in a first library, of each of the circuit blocks;

determining whether the first operation characteristic data are acceptable;

selecting those of said circuit blocks whose delays obtained by the first individual simulation are included in a given period;

executing a second simultaneous simulation of the selected circuit blocks using data of mutual intervention stored in a second library to obtain second operation characteristic data produced by the simultaneous simulation, and determining whether the second operation characteristic data are acceptable.

2. A simulation method for a semiconductor integrated circuit as claimed in claim 1, wherein the data of mutual intervention include:

a current variation rates;

a peak current value of each of those circuit blocks which exhibit a simultaneous simulation condition when the circuit block operates individually; and an impedance of a power supply line for each of the circuit blocks calculated from an equivalent circuit of power supply lines of said semiconductor integrated circuit, and wherein the second simultaneous simulation further includes the step of calculating a sum total of circuit block counter-electromotive forces from the current variation rates, peak current values, and the impedances, and wherein the determination of whether the second operation characteristic data are acceptable further includes the step of comparing the sum total with a predetermined allowable value to obtain a result.

3. A simulation apparatus for a semiconductor integrated circuit which includes a plurality of circuit blocks blocked for individual function units, comprising:

inputting means for inputting a net list, and a test pattern, wherein the net list includes connection information for each of said circuit blocks;

a first library in which first data corresponding to functions of each of the circuit blocks are stored;

first simulation means for executing a first simulation for each of said circuit blocks using the first data, the net list, and the test patterns, to obtain first operation characteristic data including delays for each of the circuit blocks;

first determination means for determining whether the first operation characteristic data are acceptable;

a second library in which data are stored regarding mutual intervention which occurs when a plurality of said circuit blocks operate simultaneously;

selecting means for selecting those of said circuit blocks whose delays obtained by the first simulation means are included in a given period;

second simulation means for executing a second simultaneous simulation of the selected circuit blocks using the data stored in said second library to obtain second operation characteristic data produced by the simultaneous simulation; and second determination means for determining whether the second operation characteristic data are acceptable.

4. A simulation apparatus for a semiconductor integrated circuit as claimed in claim 3, wherein the data regarding mutual intervention further includes:

a current variation rates;

a peak current value of each of those circuit blocks which exhibit a simultaneous operation condition when the circuit block operates individually; and an impedance of a power supply line for each of the circuit blocks calculated from an equivalent circuit of power supply lines of said semiconductor integrated circuit, and wherein said second simulation means further calculates a sum total of counter-electromotive forces of the circuit blocks calculated from the current variation rates, peak values of the individual circuit blocks, and the impedances, wherein said second determination means compares the sum total with a predetermined allowable value to obtain a result.

5. A simulation method for a semiconductor integrated circuit as claimed in claim 1, wherein the first individual simulation is separately performed individually for each of said circuit blocks.

* * * * *